United States Patent
Black

(12) United States Patent (10) Patent No.: US 6,181,201 B1
Black (45) Date of Patent: Jan. 30, 2001

(54) AUTOMATIC GAIN CONTROL CIRCUIT FOR CONTROLLING MULTIPLE VARIABLE GAIN AMPLIFIER STAGES WHILE ESTIMATING RECEIVED SIGNAL POWER

(75) Inventor: Peter J. Black, La Jolla, CA (US)

(73) Assignee: Qualcomm Incorporated, San Diego, CA (US)

(*) Notice: Under 35 U.S.C. 154(b), the term of this patent shall be extended for 0 days.

(21) Appl. No.: 09/417,204

(22) Filed: Oct. 11, 1999

Related U.S. Application Data

(63) Continuation of application No. 09/130,393, filed on Aug. 6, 1998, now Pat. No. 6,107,878.

(51) Int. Cl.[7] .................................................. H03G 3/20
(52) U.S. Cl. ..................... 330/129; 330/133; 455/241.1; 455/245.2; 455/247.1; 455/253.2
(58) Field of Search ..................................... 330/129, 133, 330/134; 455/241.1, 245.2, 247.1, 253.2, 253.1

(56) References Cited

U.S. PATENT DOCUMENTS

| | | | |
|---|---|---|---|
| 5,056,109 | * 10/1991 | Gilhousen et al. | ............... 375/1 |
| 5,638,141 | * 6/1997 | Bae et al. | ............ 455/245.2 |

FOREIGN PATENT DOCUMENTS

2115961 * 10/1972 (DE) ............................ 330/133

* cited by examiner

*Primary Examiner*—Michael B Shingleton
(74) *Attorney, Agent, or Firm*—Philip Wadsworth; Charles Brown; Tom Streeter

(57) ABSTRACT

The present invention is a novel and improved AGC circuit which is generically configurable to accommodate a variety of AGC amplifier configurations to enhance IP3 performance and reduce required amplifier current, while providing a received power estimate which remains valid regardless of how the gain or attenuation is distributed among the various amplifiers. A generic control circuit maintains this power estimate in a single overall gain amplification value by distributing gain to at least two amplifier stages in response to that value. By programming or hard coding a few key parameters, a generic control circuit can control a wide variety of amplifier configurations. Among the configurations supported are switched LNA, switched variable gain LNA, variable gain, and a decoupled IF and UHF variable gain LNA configuration. The invention is extendable to include multi-stage amplifier configurations. Although the preferred embodiment includes two stages, one for UHF and one for IF, three or more stages can easily be adapted. Various filtering schemes can be applied to the power estimate to tailor the temporal dynamics of gain switching. For example, a low pass filter can be applied to the UHF front end to give it a slower response than the IF stage. All of these configurations and any subset can be supported in a single generic device.

2 Claims, 10 Drawing Sheets

GENERIC GAIN CONTROL CIRCUIT

SWITCHED/STEPPED LNA GAIN (LNA BYPASS)

VARIABLE GAIN LNA

SWITCHED VARIABLE ATTENUATOR

SWITCHED LNA CONTROL

EXAMPLE UHF/IF ATTENUATION STATIC
TRANSFER FUNCTION

ATTENUATOR CONTROL

EXAMPLE UHF/IF ATTENUATION STATIC TRANSFER FUNCTIONS

VARIABLE GAIN LNA CONTROL

EXAMPLE UHF/IF ATTENUATION STATIC TRANSFER FUNCTION

VARIABLE GAIN LNA CONTROL

EXAMPLE UHF/IF ATTENUATION STATIC TRANSFER FUNCTION

AUTOMATIC GAIN CONTROL CIRCUIT FOR CONTROLLING MULTIPLE VARIABLE GAIN AMPLIFIER STAGES WHILE ESTIMATING RECEIVED SIGNAL POWER

CROSS-REFERENCE TO RELATED APPLICATION

This application is a continuation of U.S. application Ser. No. 09/130,393, filed Aug. 6, 1998 now U.S. Pat. No. 6,107,878.

BACKGROUND OF THE INVENTION

1. Field of the Invention

The present invention relates to automatic gain control circuits. More particularly, the present invention relates to a novel and improved automatic gain control circuit capable of independently controlling multiple variable gain amplifier stages while maintaining an estimate of received signal power.

2. Description of the Related Art

In modern communication systems, it is common for a receiver to contain automatic gain control (AGC) circuitry to amplify or attenuate received signals to a desired reference level for further processing by the receiver. An exemplary AGC circuit is described in U.S. Pat. No. 5,099,204, entitled "LINEAR GAIN CONTROL AMPLIFIER", assigned to the assignee of the present invention and incorporated herein by reference. A communication system using such AGC circuits is disclosed in U.S. Pat. No. 4,901,307, entitled "SPREAD SPECTRUM MULTIPLE ACCESS COMMUNICATION SYSTEM USING SATELLITE OR TERRESTRIAL REPEATERS", assigned to the assignee of the present invention and incorporated herein by reference. The foregoing system is also described by EIA/TIA Interim Standard IS-95, entitled "Mobile Station-Base Station Compatibility Standard for Dual-Mode Wideband Spread Spectrum Cellular system" (hereinafter IS-95), incorporated herein by reference.

A mobile station in an IS-95 system, in addition to requiring that incoming signals be gain controlled for further processing, must ensure that its transmitted signals are tightly power controlled so as not to interfere with other mobile stations in the system. Such a power control scheme is described in U.S. Pat. No. 5,056,109, entitled "METHOD AND APPARATUS FOR CONTROLLING TRANSMISSION POWER IN A CDMA CELLULAR MOBILE TELEPHONE SYSTEM", assigned to the assignee of the present invention and incorporated herein by reference. One element in this power control scheme is the use of a measurement of received signal power, and so in contrast to systems where the only requirement of an AGC circuit is to provide incoming signals at the appropriate reference level, an IS-95 AGC circuit must allow for calculation of received signal strength.

Ideally, amplifiers could be constructed which were perfectly linear, at least over some range. Then the amplifier would be characterized by the equation $f(x)=k_1 x$, where $f(x)$ is the output, $x$ is the input and $k_1$ is the gain of the amplifier. In reality, amplifiers are not perfectly linear, and that non-linearity introduces distortion into the signal being amplified. Of all the possible input voltages, an amplifier has what is called its "linear" range and its "non-linear" range. The linear range is where the amplifier most closely approximates a linear amplifier. The distortion introduced can be approximated as a third order component. A more realistic characterization of an amplifier is given by the equation $f(x)=k_1 x + k_3 x^3$. Here $k_3$ is the gain of the third order component. An amplifier with a smaller value for $k_3$ will be more linear than an amplifier with a higher value.

One type of distortion introduced by non-linear amplifiers that is particularly troublesome comes from intermodulation terms of two frequencies that are outside the band of interest for a mobile station. An example of this can be seen when an IS-95 system is deployed in close proximity to a narrow-band system such as AMPS or GSM. The performance of an amplifier with respect to intermodulation is given by its IP3 point. For calculation purposes, it is assumed that the transmitters of the desired band and the source of the undesired frequencies are co-located. This means that as a mobile station moves toward the transmitter, both the desired received power and the intermodulation power increase. The IP3 point is the point where the third order intermodulation power of two equal power tones offset in frequency is equal to the desired first order term. To optimize the IP3 performance of an amplifier, the third order gain, $k_3$, should be minimized.

One way to increase IP3 performance is to increase the "linear" range of the amplifier. Supplying more current to the amplifier can do this. However, in typical mobile communication systems, power in a mobile station is at a premium and increasing current is only done when absolutely necessary. Reduced power consumption translates into increased standby and talk time in a mobile station, or alternatively in a reduced battery requirement that leads to smaller and lighter mobile stations. An alternative to increasing the linear range is to reduce the amplitude of the incoming signal so that it stays within the existing linear range of the amplifier.

IS-95 specifies a minimum level of what it describes as intermod rejection. FIG. 1 shows a typical intermod rejection ratio plot. For a given range of received power, the receiver must be able to tolerate a certain amount of interference, or have a certain intermod rejection ratio (IMR), as shown by the line labeled "spec" between specification points S1 and S2. The intermod rejection ratio of an amplifier with fixed IP3 will increase ⅓ of a dB for every dB increase in received input power. The slope of the spec line may not be ⅓ of a dB per dB, and in fact it is not in IS-95. The IS-95 slope is approximately a 1 dB per dB slope. For a spec as shown, an amplifier must meet the specification at point S2. This would yield an IMR given by the line A1. To meet the specification requirement at point S1, a lower current amplifier could be used which would yield an IMR given by A2. As shown, the amplifier that meets point S2 is overdesigned for point S1. This overdesign can equates to an increase in bias current resulting in reduced battery life, or more expensive components being required, or both.

An AGC design that could exhibit the properties attributed to lines A1 or A2 is shown in FIG. 2. Received signals at antenna 100 are directed to ultra high frequency (UHF) low noise amplifier (LNA) 110. A dashed arrow is shown through amplifier 110 to indicate the option of having it be a variable gain amplifier. That variable gain configuration will be discussed below. The received signal is amplified by LNA 110 and downconverted in mixer 115 via UHF frequency generated by UHF local oscillator 120. The downconverted signal is passed through band pass filter 130 and amplified by intermediate frequency (IF) variable gain amplifier 140. This amplified IF signal is then downconverted in mixer 145 via IF frequency generated by IF frequency generator 150. The received signal is now at baseband, and received signal strength indicator (RSSI) 160 generates an estimate of the received signal power. The difference of this estimate and a reference power stored in power reference 165 is calculated in adder 170, and RX AGC 180 acts on this error difference to produce the appropriate AGC_VALUE 195. AGC_VALUE 195 is fed through a linearizer 190 to variable gain amplifier 140. Linearizer 190 compensates for any non-linear dB/V characteristics of variable gain amplifier 140. Linearization is described in U.S. Pat. No. 5,627,857, entitled "LINEARIZED DIGITAL AUTOMATIC GAIN CONTROL", assigned to the assignee of the present invention and incorporated herein by reference. RX AGC 180 could be a variety of circuits as known in the art which alter AGC_VALUE so as to drive the difference calculated in adder 170 to as close to zero as possible. Once this loop is converged, the baseband signal out of mixer 145 is at the appropriate input power level and can be further demodulated (in circuitry not shown). Typically, the IF downconversion is done on the in-phase and quadrature components of the signal, and additional filtering is performed, but those details are not shown for the sake of clarity. The circuit as just described will exhibit the IMR response of line A1 in FIG. 1 when designed at a fixed current level. Note that AGC_VALUE can be used to estimate the received power, but only after factoring in the gain from the entire receive chain.

One way to reduce the overuse of current is to use a lower current amplifier than would be required to generate line A1 and introduce variability in the front end gain stage, LNA 110, as shown by the dashed arrow in FIG. 2. As an example, assume that this is a switched fixed gain LNA, meaning it is either on with a fixed gain or bypassed altogether. When LNA 110 is switched out, the amplification will be reduced, or attenuation will be added. This reduces the linear range requirement for IF amplifier 140.

When the LNA stage is switched out, a performance cost is paid through an increased noise floor. The carrier to interference (C/I) figure is approximated as this thermal noise floor from the amplifier circuits plus the intermod components plus the co-channel interference. The performance of the demodulator is a function of the baseband C/I. As the received power (C) increases, the total interference can increase. Given that the noise floor remains approximately constant if no LNA switching is performed, the excess margin can be traded for improved IP3 performance by switching off the amplifier which results in improved IP3 performance at the expense of increased noise floor.

FIG. 3 shows an IMR spec that is the same as shown in FIG. 1. However, the IMR of the variable gain LNA just described is quite different from IMR lines A1 or A2. The amplifier must have a linear range and current consumption to support the IMR given by line segment R1. This is less current than the amplifier needed to supply line A1 of FIG. 1. As the input power is increased, the range of linearity of this amplifier is used up, and without more, would fall below spec point S3. Instead, the attenuation is added by switching out LNA 110 and therefore the inputs to IF amplifier 140 are back within its linear range and the IP3 performance goes up, in this example to the performance comparable to the amplifier required to produce line A1. This is shown by line segment R2. In a similar manner, if a truly variable gain LNA 110 is used, rather than the simple on/off example just demonstrated, the performance of the AGC amplifier chain can be made very close to the minimum spec required, and hence the minimum power consumption required.

The total gain value in the amplifier chain in the AGC can be used as a measure of the total received power. This is because the basic function of an AGC is to take an input power level and reduce it to a reference power level by applying a gain factor. If the gain factor is known, then the actual received power is also known since the reference power is known. However, for improved IP3 performance, it is desirable to be able to change the distribution of attenuation or gain throughout the amplifiers in the AGC chain. But note that once the gain is distributed among stages, AGC_VALUE 195 is no longer a good estimate. As shown above, a distribution of gain through a variety of amplifiers does not necessarily yield automatically an overall AGC gain value which can be used as a received power estimate (and hence for a transmit power estimate). There is a need in the art for an AGC circuit that is controllable to enhance IP3 performance while yielding a usable estimate of the received power.

SUMMARY OF THE INVENTION

The present invention is a novel and improved AGC circuit which is generically configurable to accommodate a variety of AGC amplifier configurations to enhance IP3 performance and reduce required amplifier current, while providing a received power estimate which remains valid regardless of how the gain or attenuation is distributed among the various amplifiers. A generic control circuit maintains this power estimate in a single overall gain amplification value by distributing gain to at least two amplifier stages in response to that value. By programming or hard coding a few key parameters, a generic control circuit can control a wide variety of amplifier configurations. Among the configurations supported are switched LNA, switched variable gain LNA, variable gain, and a decoupled IF and UHF variable gain LNA configuration. The invention is extendable to include multi-stage amplifier configurations. Although the preferred embodiment includes two stages, one for UHF and one for IF, three or more stages can easily be adapted. Various filtering schemes can be applied to the power estimate to tailor the temporal dynamics of gain switching. For example, a low pass filter can be applied to the UHF front end to give it a slower response than the IF stage. All of these configurations and any subset can be supported in a single generic device.

BRIEF DESCRIPTION OF THE DRAWINGS

The features, objects, and advantages of the present invention will become more apparent from the detailed description set forth below when taken in conjunction with the drawings in which like reference characters identify correspondingly throughout and wherein.

DETAILED DESCRIPTION OF THE PREFERRED EMBODIMENTS

Figure 4A:
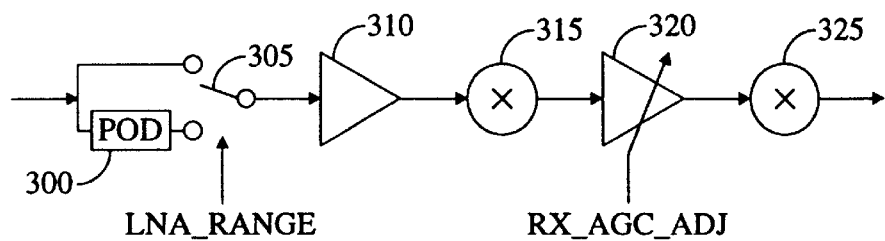
FIG. 4A is a switched/stepped LNA gain configuration.
Figure 4B:
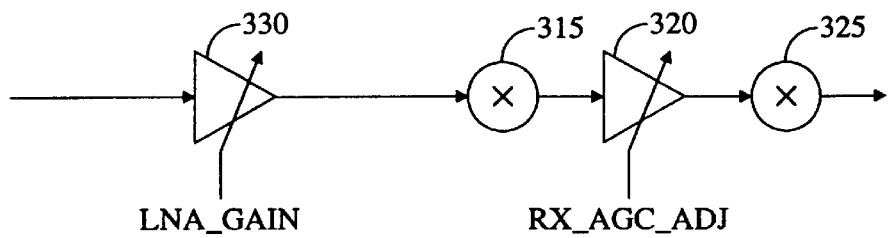
FIG. 4B is a variable LNA gain configuration.
Figure 4C:
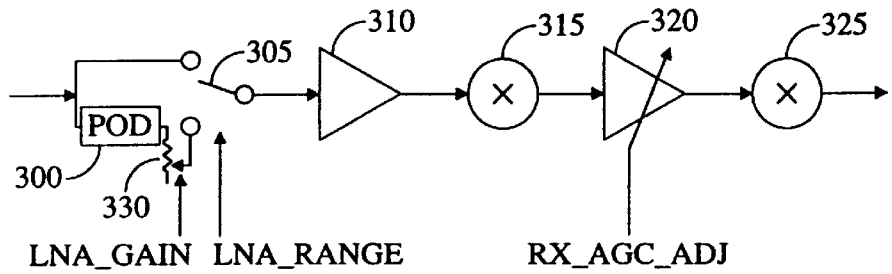
FIG. 4C is a switched variable attenuator.

The present invention provides generic AGC control for a variety of amplifier configurations. FIGS. 4A–4C show conceptually the various types of amplifier configurations that are supported in the invention. These are shown merely as examples.

FIG. 4A shows a switched/stepped LNA gain configuration, which is conceptually the same as an LNA bypass. Switch 305, under control of signal LNA_RANGE, selects between the incoming signal and the incoming signal that has been attenuated through pad 300. The switched signal passes through LNA 310, UHF mixer 315, and into IF variable gain control amplifier 320. IF amplifier 320 selects its gain value under control of signal RX_AGC_ADJ. The amplified signal is then downconverted to baseband through IF mixer 325. In practice, the attenuation through pad 300 may be realized through bypassing LNA 310 instead of attenuating the signal. This is equivalent to bypassing one or more stages of a multistage LNA.

FIG. 4B shows a variable gain LNA configuration. It differs from FIG. 4A in the front end only. Instead of switching a fixed attenuation in or our under control of signal LNA_RANGE, pad 300, switch 305, and LNA 310 are replaced by variable gain LNA 330 which sets its gain according to signal LNA_GAIN.

FIG. 4C shows a switched variable attenuator. Again, it only differs from FIG. 4A and FIG. 4B in the front end. Like FIG. 4A, this circuit switches attenuation on or off through switch 305 under control of signal LNA_RANGE. However, variable attenuator 330 under control of signal LNA_GAIN provides the attenuation.

Figure 1:
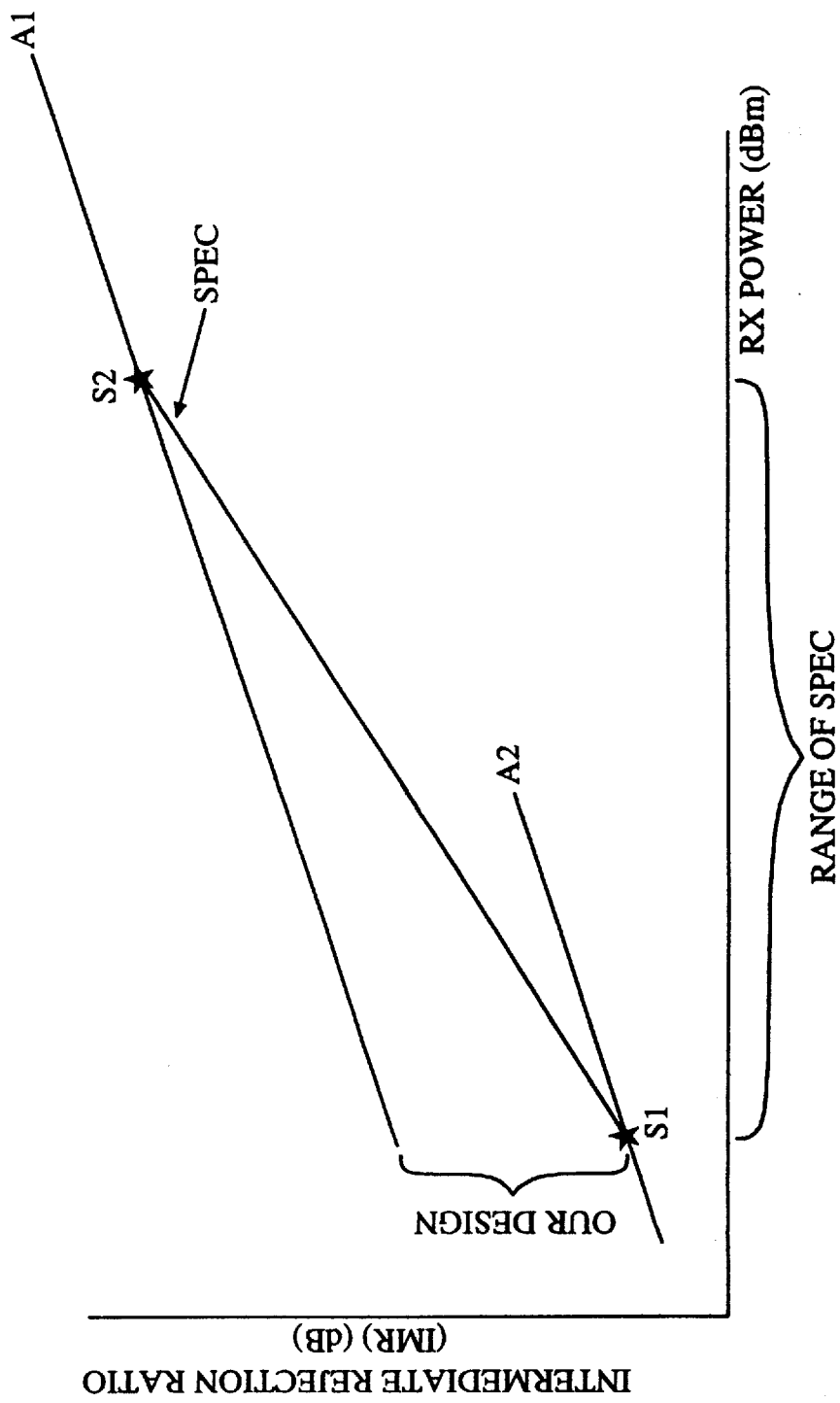
FIG. 1 is a typical intermod rejection ratio plot.
Figure 2:
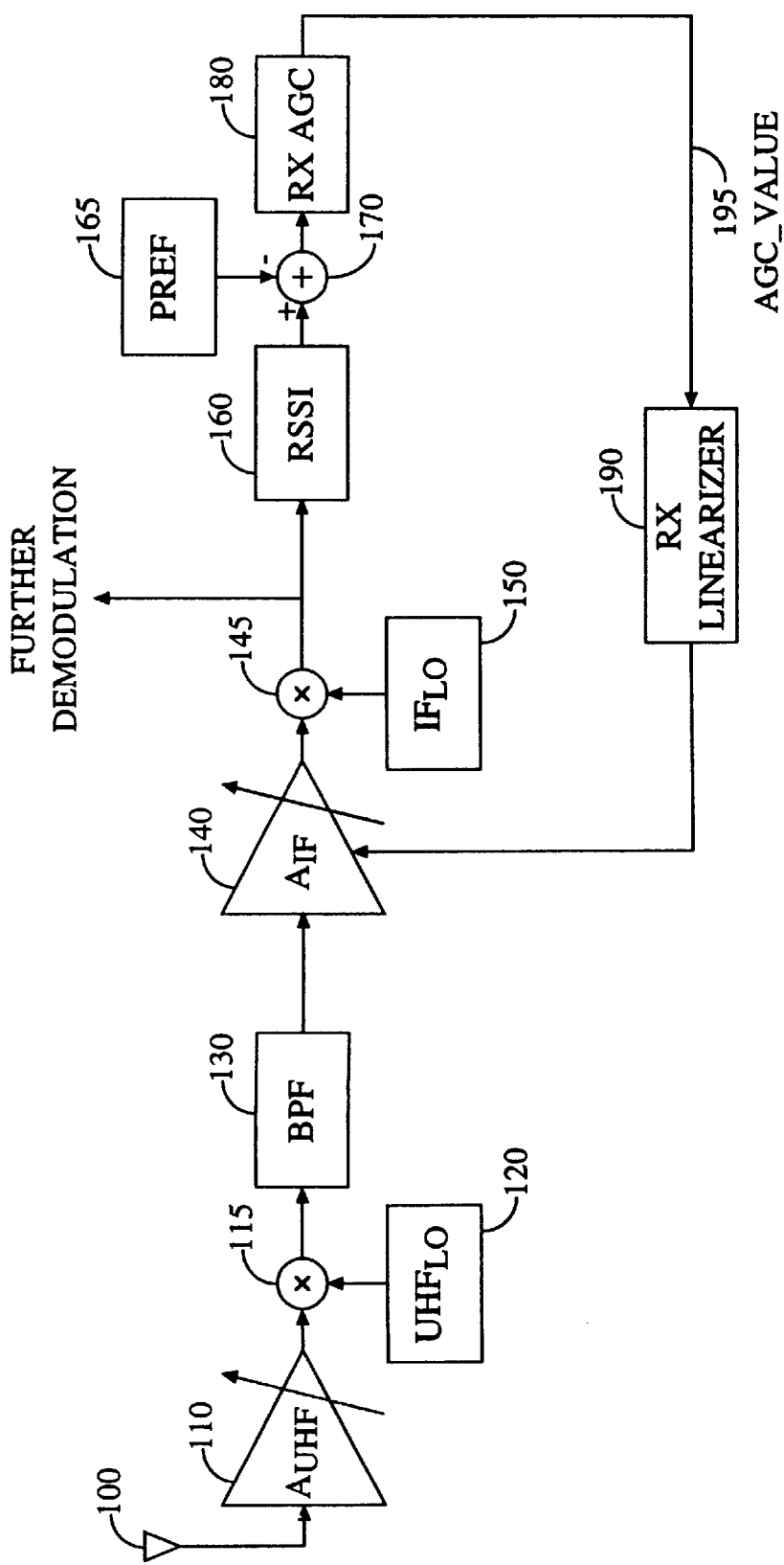
FIG. 2 is a prior art AGC circuit.
Figure 3:
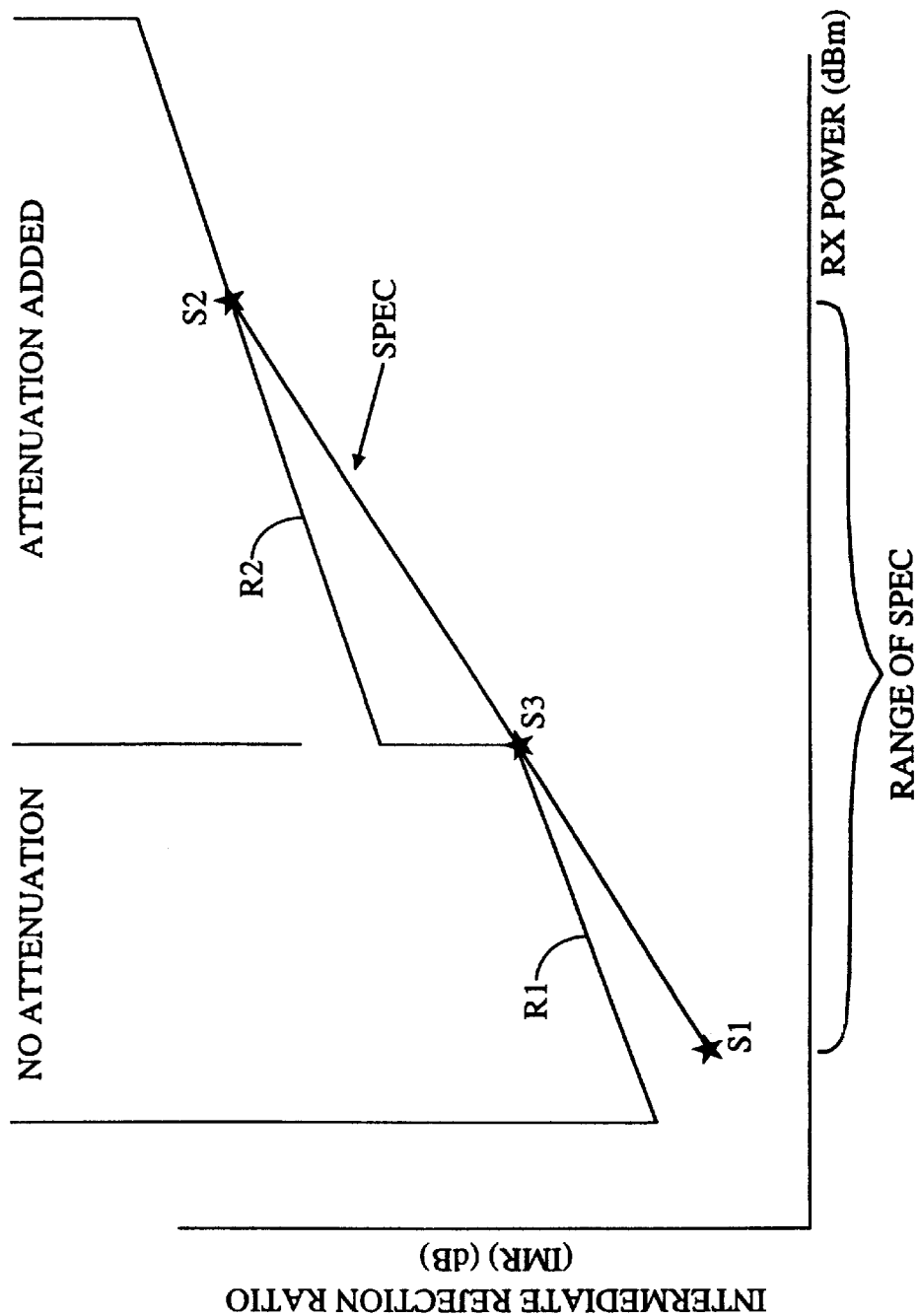
FIG. 3 is an intermod rejection ratio plot in conjunction with a switched LNA AGC configuration.
Figure 5:
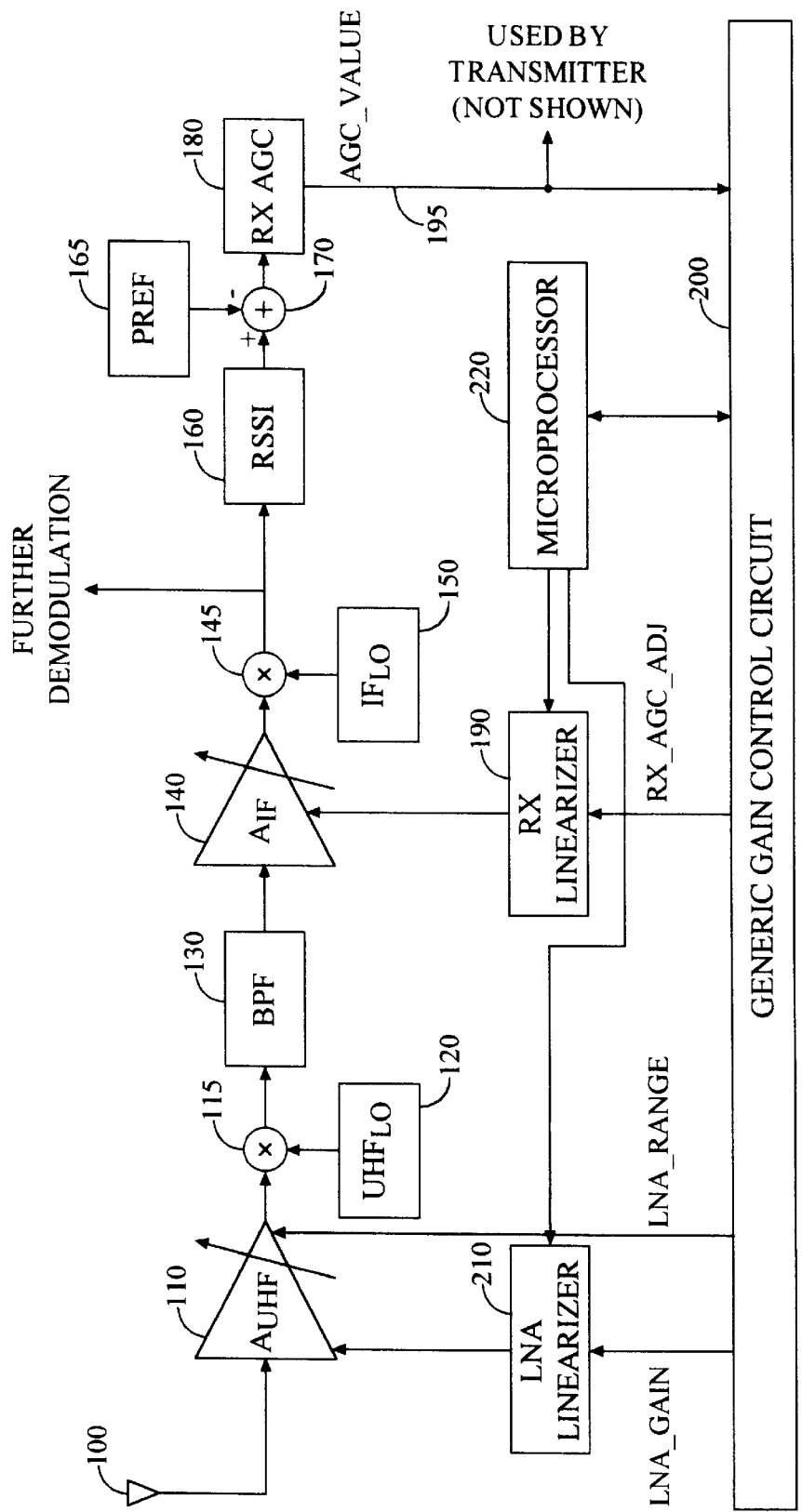
FIG. 5 shows the preferred embodiment of the present invention.

FIG. 5 shows one preferred embodiment of the present invention. It is similar to the circuit shown in FIG. 2, but has a number of important differences. Generic gain control circuit 200 is inserted before RX linearizer 190, and takes AGC_VALUE 195 as an input. Generic gain control circuit 200, described more fully below, provides control to UHF LNA 110 and IF variable gain amplifier 140. It also operates in conjunction with optional linearizer 190 and optional LNA linearizer 210 (which is another addition to FIG. 2). As shown, UHF LNA 110 is variable gain, but that is optional. All of the conceptual modes described in FIGS. 4A–4C can be configured and controlled by generic gain control circuit 200. UHF LNA 110, if variable gain, is gain controlled by signal LNA_GAIN through LNA linearizer 210 (if a linearizer is needed). If a switchable LNA configuration is being utilized, UHF LNA 110 is switched on or off via signal LNA_RANGE. IF variable gain amplifier 140 is controlled by signal RX_AGC_ADJ through RX linearizer 190 (if a linearizer is needed). Note that all amplifiers are controlled by generic gain control circuit 200 based on signal AGC_VALUE 195. As such, regardless of the distribution of gains to various amplifiers in any of the supported configurations, AGC_VALUE specifies the gain of the overall amplifier chain and, as described above, can be used as a measure of received power. This measure can be used as a power reference in a transmitter (not shown).

Although this circuit will function with all necessary parameters hard coded, in the exemplary embodiment microprocessor 220 is deployed to control the circuitry and receive feedback from it. Microprocessor 220 is used to configure generic gain control circuit 200, and may provide linearization values to linearizers 210 and 190, if linearizers are needed.

Figure 6:
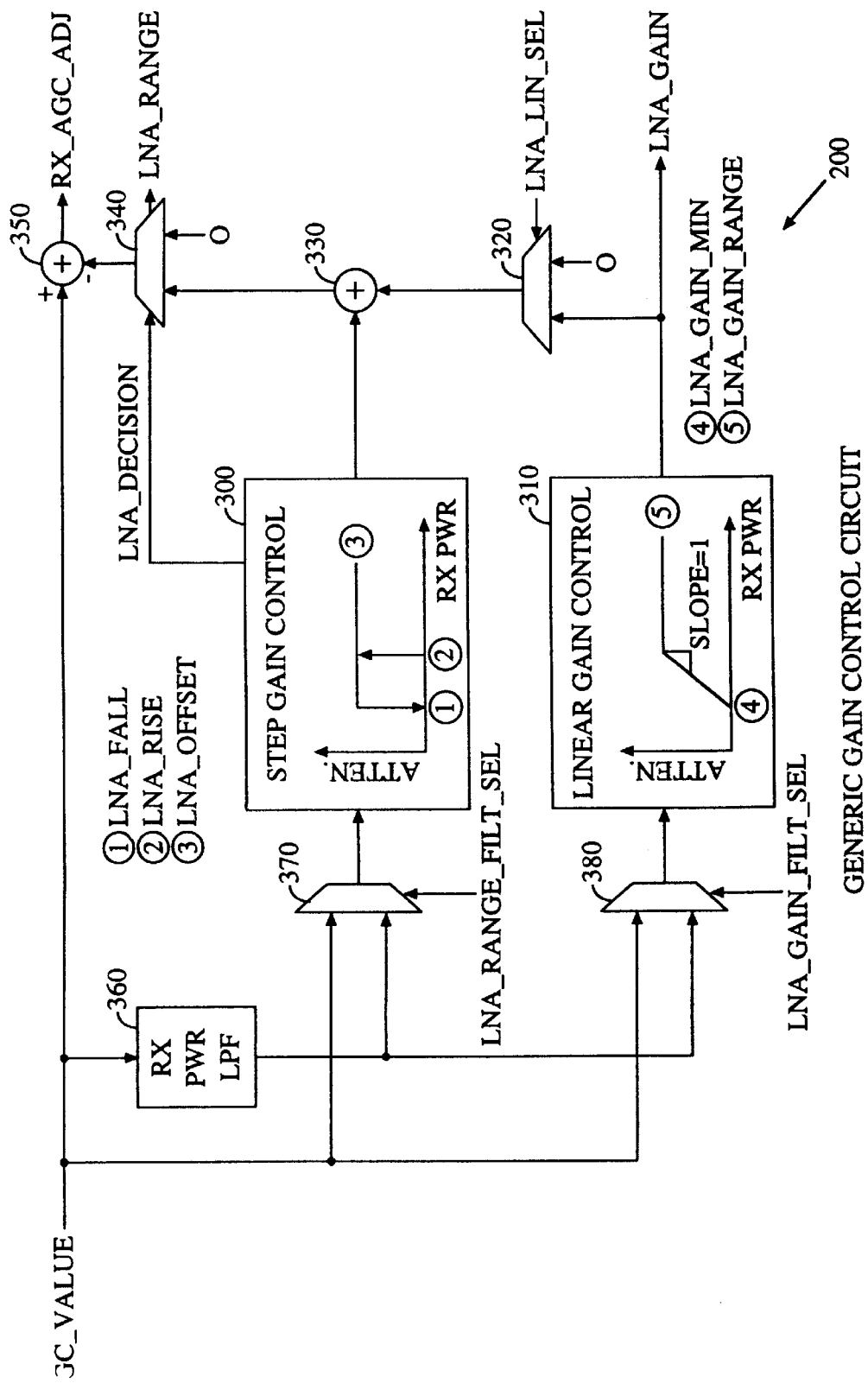
FIG. 6 details the generic gain control circuit of the present invention.

Generic gain control circuit 200 is detailed in FIG. 6. Signal AGC_VALUE, which represents the gain of the entire amplifier chain, is fed into summer 350. Any gain that is distributed to other stages of the amplifier chain is subtracted from AGC_VALUE, and the balance is used as the gain factor RX_AGC_ADJ. Regardless of the actual gain distribution, signal AGC_VALUE remains a valid estimate of received signal power, useful for tasks such as transmit power control.

In standard operation, step gain control 300 and linear gain control 310 act upon AGC_VALUE. However, multiplexors 370 and 380 are part of an optional configuration by which a low pass filtered version of AGC_VALUE, created by RX power LPF 360, are used instead of AGC_VALUE. Signal LNA_RANGE_FILT_SEL is used to control selection of filtered or unfiltered signal AGC_VALUE through multiplexor 370. Signal LNA_GAIN_FILT_SEL is used to control selection of filtered or unfiltered signal AGC_VALUE through multiplexor 380. When the low pass filtered AGC_VALUE is selected, then the AGC is primarily IF (fast loop) with a slow outer loop adjusting the UHF gain based on a longer term estimate of the RX power. A slower adjustment of the UHF gain is desirable to maintain intermod rejection during in-band fades. Note that due to the novel design of this control scheme, regardless of whether a filtered AGC_VALUE or the raw AGC_VALUE is used in step and linear gain control blocks 300 or 310 (or any number of additional gain stages or gain distribution schemes one might employ) any residual gain is always provided through RX_AGC_ADJ. Therefore, the total gain is always equal to the instantaneous value of AGC_VALUE. For clarity, in the following discussion, the filter option is not discussed, but it could also be included with no loss of generality.

Linear gain control 310 acts upon AGC_VALUE to produce signal LNA_GAIN. It is configured through two settings, LNA_GAIN_MIN and LNA_GAIN_RANGE. As shown, when RX pwr, which is the input to linear gain control 310 from multiplexor 380, is less than (4), LNA_GAIN_MIN, then LNA_GAIN will be zero. As RX pwr increases past (4), the output increases with a slope of 1, providing a dB per dB increase, until LNA_GAIN reaches the level programmed by (5), LNA_GAIN_RANGE. LNA_GAIN is used to control a variable gain LNA deployed as UHF LNA 110 in FIG. 5. Note that linearizer tables can be configured to provide other than dB per dB ramps in actual gain if desired. This optional feature will be discussed further below. LNA_GAIN is fed into multiplexor 320, where it will be passed on to summer 330 unless it is zeroed out as programmed with signal LNA_LIN_SEL.

Step gain control 300 acts upon the AGC_VALUE to provide a selector signal LNA_DECISION to multiplexor 340 and the value LNA_OFFSET to summer 330, where it is added to the value from multiplexor 320. Step gain control 300 is programmed via LNA_FALL, LNA_RISE, and LNA_OFFSET. As shown, when RX pwr, which is the input to step gain control 300 from multiplexor 370, is less than (2), LNA_RISE, then the output of this block will be zero. As RX pwr increases past (2), the output steps up to the value programmed by (3), LNA_OFFSET. LNA_DECISION is then activated to select the value from summer 330 instead of the value zero. The output will remain at the step value (3), LNA_OFFSET, until Rx pwr drops below (1), LNA_FALL. If this happens, the output will be set back to zero and LNA_DESCISION will be deactivated. Independent control of (1) and (2) allows for hysteresis to be programmed in so that an amplifier is not excessively switched at a single threshold activation point.

LNA_DECISION is used to provide LNA_RANGE, a control signal to activate a switched LNA that has been deployed as UHF LNA 110 in FIG. 5. LNA_RANGE may be slightly altered from LNA_DECISION. For example, delay may be added to coordinate with characteristics of the amplifier. LNA_DECISION can alternatively be controlled by a microprocessor to override control of UHF LNA 110.

The output of multiplexor 340 represents the gain that has been distributed to the UHF stage amplifier. It is subtracted from AGC_VALUE in summer 350 and the balance is used as a gain value for the IF stage amplifier. It is clear to one skilled in the art that this solution can be extended and modified without changing the basic structure such that the AGC_VALUE is used to close the AGC loop and provide an estimate of received power while the actual gain is distributed among a variety of amplifiers. More than two amplifier stages can be controlled and their gains would be summed and subtracted in the manner shown above. Similarly, alternate schemes of filtering the AGC_VALUE could be employed, and the invention as taught will provide the desired features.

Figure 7A:
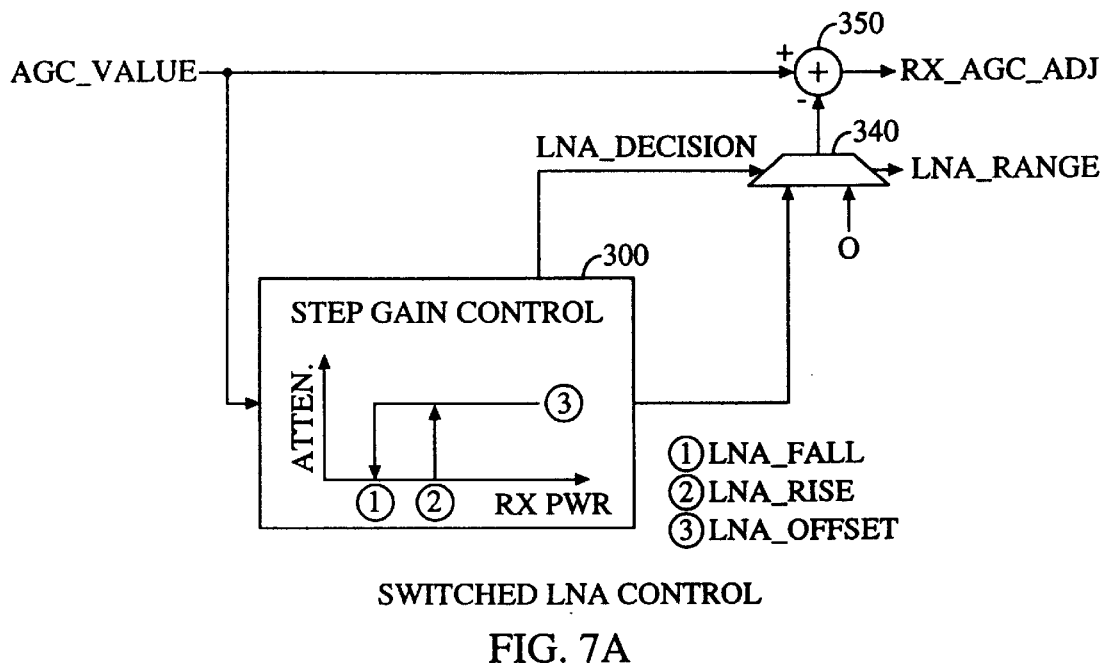
FIG. 7A shows the generic gain control circuit configured for use with a switched LNA.
Figure 7B:
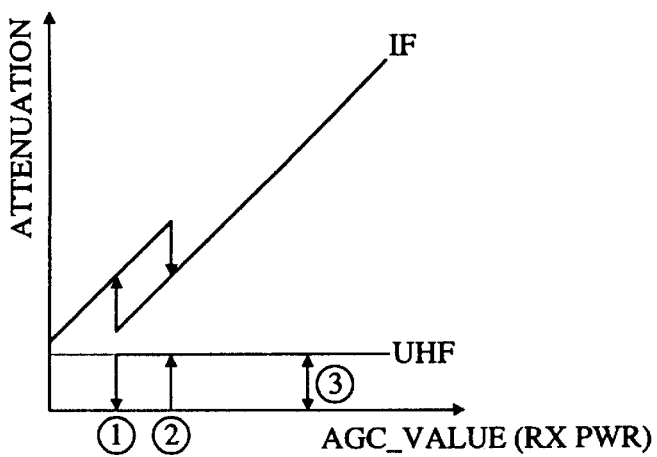
FIG. 7B shows an example UHF/IF attenuation static transfer function corresponding to the configuration shown in FIG. 7A.

FIG. 7A shows generic gain control circuit 200 configured so as to perform switched LNA control, as conceptually shown in FIG. 4A. This configuration would be useful with a switchable single gain UHF LNA 110 (shown in FIG. 5). In this configuration, the LNA_GAIN output is not used. LNA_LIN_SEL is used to select zero to be added to summer 330. Alternatively, LNA_GAIN_RANGE could be set to always provide zero on the LNA_GAIN output. LNA_OFFSET, (3), is programmed to match the gain provided by the UHF LNA. As described above, the UHF LNA is switched on and off according to RX Pwr and the parameters LNA_FALL, (1), and LNA_RISE, (2). An example of the resulting attenuation for each of the IF and UHF gain stages is plotted in FIG. 7B. Note that the sum of the IF and UHF gains is equal to input AGC_VALUE, as would be expected.

Figure 8A:
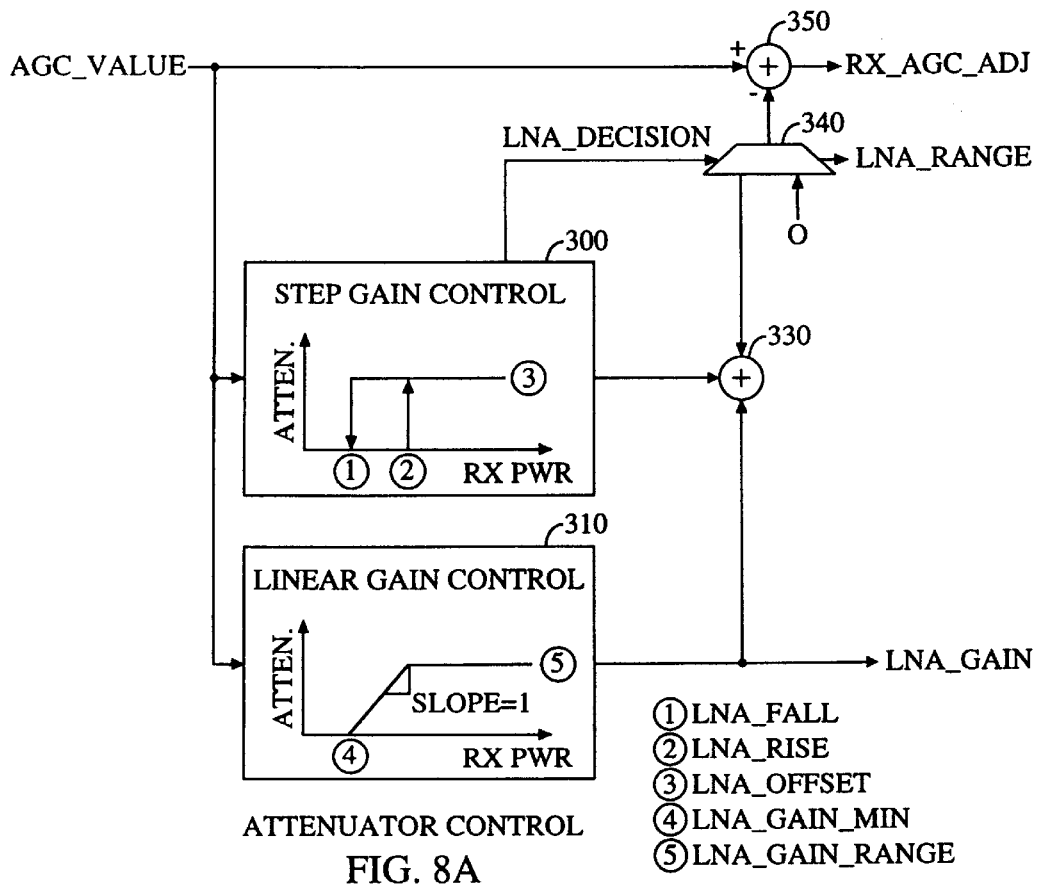
FIG. 8A shows the generic gain control circuit configured for use with a switched variable gain attenuator.
Figure 8B:
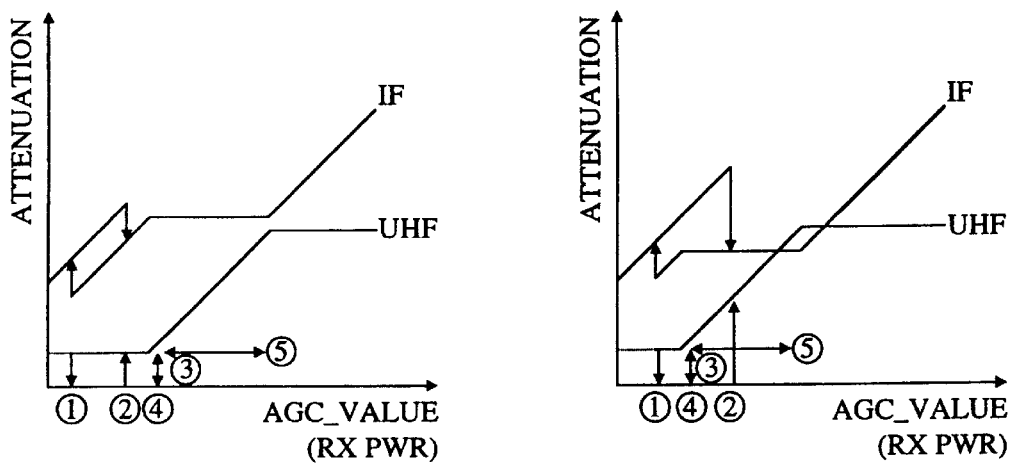
FIG. 8B shows example UHF/IF attenuation static transfer functions corresponding to the configuration shown in FIG. 8A.

FIG. 8A shows generic gain control circuit 200 configured so as to perform switched variable gain LNA control, as conceptually shown in FIG. 4C. This configuration would be useful with a switchable variable gain UHF LNA 110 (shown in FIG. 5). LNA_LIN_SEL is used to select LNA_GAIN to be added to summer 330. LNA_GAIN_MIN, (4), and LNA_GAIN_RANGE, (5) are programmed as described above, and LNA_GAIN is adjusted accordingly. LNA_OFFSET, (3), is programmed to match the gain provided by the UHF LNA. As described above, the UHF LNA is switched on and off according to RX Pwr and the parameters LNA_FALL, (1), and LNA_RISE, (2). Two examples of the resulting attenuation for each of the IF and UHF gain stages are plotted in FIG. 8B. The two examples highlight the difference in behavior based on the relative positions of (2) and (4). In example (a), the LNA is turned on before any linear gain term is added. In example (b), the linear term has risen above zero before the LNA is actually switched on. Note that the sum of the IF and UHF gains is still equal to input AGC_VALUE, as would be expected.

Figure 9A:
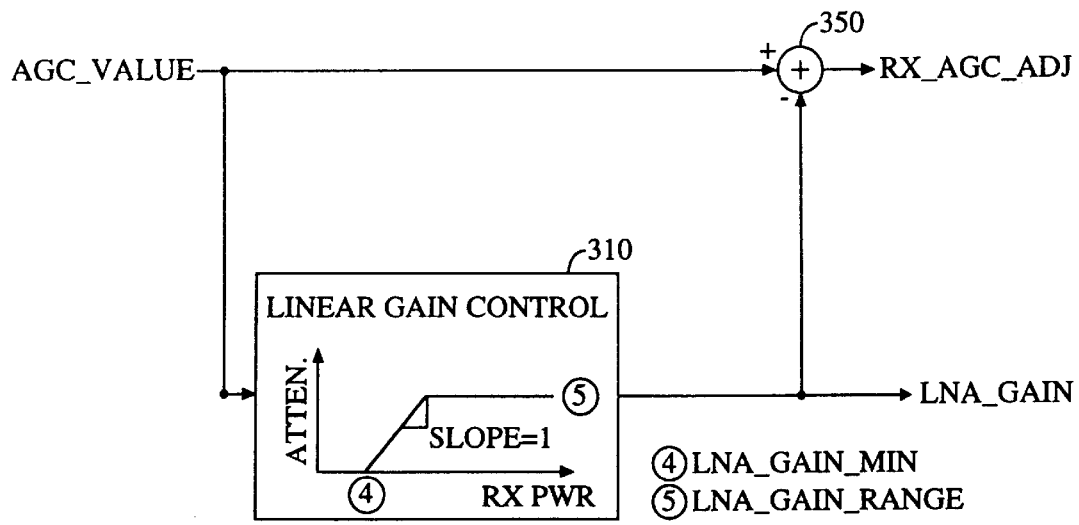
FIG. 9A shows the generic gain control circuit configured for use with a non-switched variable gain LNA.
Figure 9B:
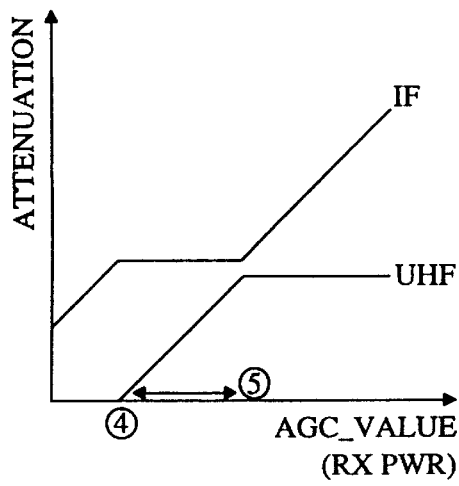
FIG. 9B shows an example UHF/IF attenuation static transfer function corresponding to the configuration shown in FIG. 9A.

FIG. 9A shows generic gain control circuit 200 configured so as to perform variable gain LNA control, as conceptually shown in FIG. 4B. This configuration would be useful with a non-switchable variable gain UHF LNA 110 (shown in FIG. 5). In this configuration, the LNA_RANGE output is not used. LNA_DECISION is overridden to activate multiplexor 340 to select the output of summer 330. Alternatively, LNA_RISE, (2), and LNA_FALL (1), can be programmed such that LNA_DECISION is always on. LNA_LIN_SEL is used to select LNA_GAIN to be added to summer 330. The output of step gain control 300 must be set to zero, which can be accomplished by programming (3), LNA_OFFSET, to zero, or alternatively programming (1) and (2) such that the output is never on. LNA_GAIN_MIN, (4), and LNA_GAIN_RANGE, (5) are programmed as described above, and LNA_GAIN is adjusted accordingly. An example of the resulting attenuation for each of the IF and UHF gain stages is plotted in FIG. 9B. Here again, note that the sum of the IF and UHF gains is equal to input AGC_VALUE.

Figure 10A:
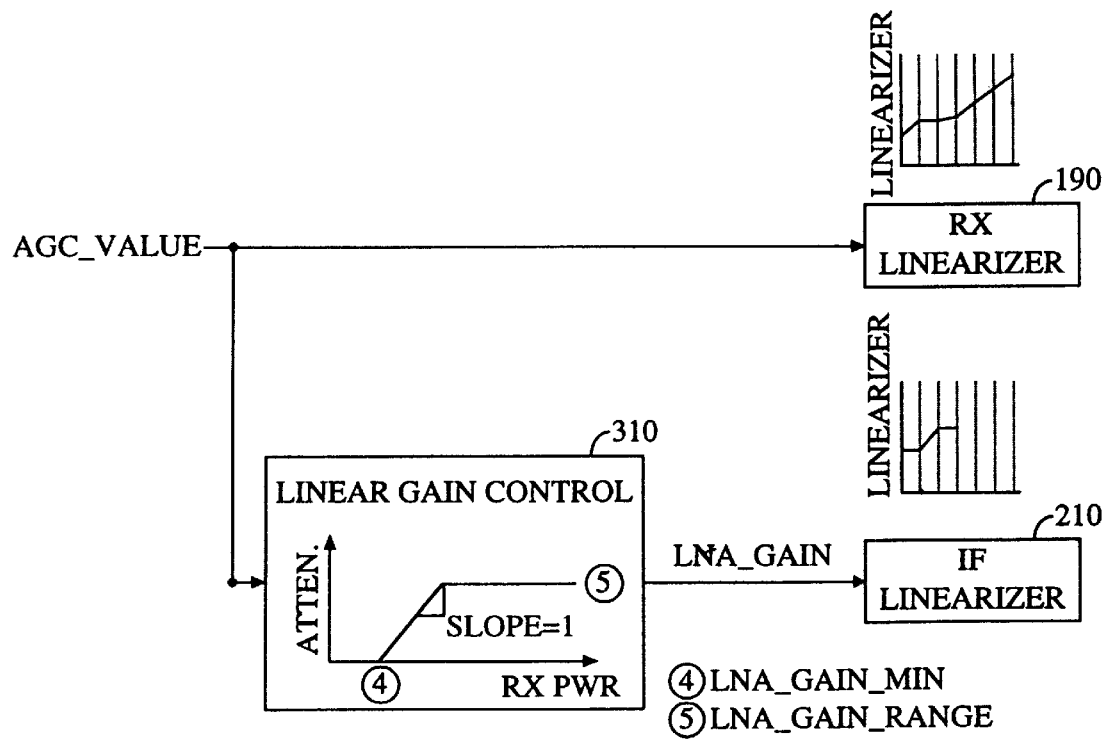
FIG. 10A shows the generic gain control circuit configured for use with a non-switched variable gain LNA in an alternate, decoupled IF/UHF gain configuration.
Figure 10B:
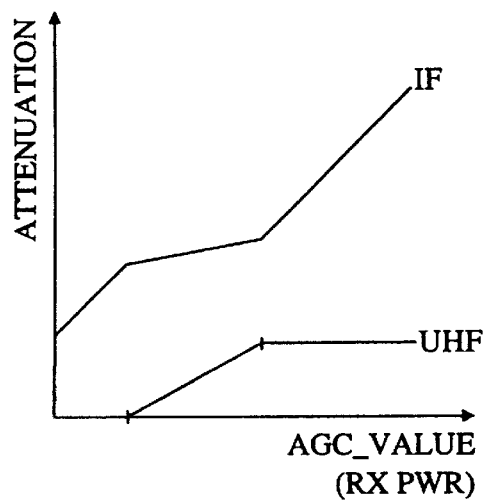
FIG. 10B shows an example UHF/IF attenuation static transfer function corresponding to the configuration shown in FIG. 10A.

FIG. 10A shows generic gain control circuit 200 configured so as to perform an alternate type of variable gain LNA control. This configuration would be useful with a non-switchable variable gain UHF LNA 110 (shown in FIG. 5). In this configuration, the LNA_GAIN and RX_AGC_ADJ paths are decoupled. The linearizers, RX linearizer 190 and LNA linearizer 210 are programmed so as to specify the relative gain distribution between the IF and UHF amplifiers. The LNA_RANGE output is not used. LNA_DECISION is overridden to activate multiplexor 340 to select zero. The output of step gain control 300 will thus be ignored. LNA_GAIN_MIN, (4), and LNA_GAIN_RANGE, (5) are programmed as described above, and LNA_GAIN is adjusted accordingly. An example of the resulting attenuation for each of the IF and UHF gain stages is plotted in FIG. 10B. Once again, the sum of the IF and UHF gains is equal to input AGC_VALUE.

The previous description of the preferred embodiments is provided to enable any person skilled in the art to make or use the present invention. The various modifications to these embodiments will be readily apparent to those skilled in the art, and the generic principles defined herein may be applied to other embodiments without the use of the inventive faculty. Thus, the present invention is not intended to be limited to the embodiments shown herein but is to be accorded the widest scope consistent with the principles and novel features disclosed herein.

I claim:

1. An apparatus for gain control comprising:
   a plurality of gain control means for producing a plurality of gain values in response to an overall gain value;
   adder means for producing an additional gain value which is the difference of the overall gain value and the sum of said plurality of gain values.

2. A method for gain control comprising:
   producing a plurality of gain values for a plurality of gain control means in response to an overall gain value;
   producing an additional gain value by subtracting of the sum of said plurality of gain values from the overall gain value.

* * * * *